United States Patent
Mittelstadt

(10) Patent No.: US 12,424,839 B2
(45) Date of Patent: Sep. 23, 2025

(54) SOLENOID-BASED VOLTAGE IMBALANCE PROTECTION

(71) Applicant: Schneider Electric USA, Inc., Andover, MA (US)

(72) Inventor: Chad R. Mittelstadt, Cedar Rapids, IA (US)

(73) Assignee: Schneider Electric USA, Inc., Boston, MA (US)

(*) Notice: Subject to any disclaimer, the term of this patent is extended or adjusted under 35 U.S.C. 154(b) by 177 days.

(21) Appl. No.: 18/228,652

(22) Filed: Jul. 31, 2023

(65) Prior Publication Data

US 2024/0222953 A1 Jul. 4, 2024

Related U.S. Application Data

(60) Provisional application No. 63/436,559, filed on Dec. 31, 2022.

(51) Int. Cl.
*H02H 3/28* (2006.01)
*H02H 1/00* (2006.01)

(52) U.S. Cl.
CPC ........... *H02H 3/28* (2013.01); *H02H 1/0007* (2013.01)

(58) Field of Classification Search
CPC ........... H01F 2007/1692; H01H 83/14; H01H 83/142; H01H 83/144; H01H 2083/146; H01H 2083/148; H01H 83/226; H01H 47/14; H02H 3/28; H02H 1/0007; G01R 29/16
See application file for complete search history.

(56) References Cited

U.S. PATENT DOCUMENTS

| | | | | |
|---|---|---|---|---|
| 2,065,118 A | * | 12/1936 | Davis, Jr. | G01N 27/9006 324/241 |
| 3,351,850 A | * | 11/1967 | Crawford | H01F 29/10 336/134 |
| 4,479,162 A | * | 10/1984 | Offutt | H01F 7/1607 335/266 |

(Continued)

OTHER PUBLICATIONS

Search Report and Written Opinion for International App. No. PCT/US2023/085973 dated Apr. 19, 2024, 7 pages.

*Primary Examiner* — Danny Nguyen
*Assistant Examiner* — Nicolas Bellido
(74) *Attorney, Agent, or Firm* — Troutman Pepper Locke LLP

(57) ABSTRACT

Apparatuses and methods herein provide a voltage imbalance detector that employs two solenoid coils, each coil coaxially arranged around a slidable metal plunger on opposite sides thereof. One coil is electrically connected to one line of a 120 V/240 V power supply and to neutral, while the other coil is electrically connected to the other line of the 120 V/240 V power supply and to neutral. When the coils are energized by current from the power supply, each coil induces an equal but opposite electromagnetic force acting on the metal plunger if the power supply voltages are balanced, thereby maintaining the plunger stationary relative to the coils. But if the voltages are not balanced, then one coil will induce a greater (or lesser) electromagnetic force than the other coil, resulting in the plunger moving toward (or away from) the first coil, thereby sensing the voltage imbalance.

19 Claims, 12 Drawing Sheets

(56) References Cited

U.S. PATENT DOCUMENTS

| | | | | |
|---|---|---|---|---|
| 4,486,728 A | * | 12/1984 | Hastings | H01F 7/1607 |
| | | | | 335/256 |
| 8,773,114 B2 | | 7/2014 | Hayashi et al. | |
| 2011/0234210 A1 | * | 9/2011 | Hayashi | G01B 7/003 |
| | | | | 324/207.15 |
| 2016/0196911 A1 | | 7/2016 | Comtois et al. | |

* cited by examiner

SOLENOID-BASED VOLTAGE IMBALANCE PROTECTION

CROSS-REFERENCE TO RELATED APPLICATIONS

This application claims the benefit of priority to and incorporates herein by reference U.S. Provisional Application No. 63/436,559, entitled "SOLENOID-BASED VOLTAGE IMBALANCE PROTECTION," filed Dec. 31, 2022.

TECHNICAL FIELD

Embodiments of the present disclosure relate to circuit protection devices and, more particularly, to apparatuses and methods that use a solenoid to provide voltage imbalance detection and protection.

BACKGROUND

In 120 V/240 V electrical power systems, such as those common in homes and other residential dwellings, many appliances and loads rely on a good neutral connection to the utility transformer. An imbalance in a 120 V/240 V or similar single-phase power supply can arise when the neutral connection to the utility transformer is lost. Such a voltage imbalance can cause problems for many loads that are powered by the 120 V/240 V power supply, including excessive heating and damage to the loads.

A lost neutral connection can occur when the neutral wire between the utility transformer and the home or other residential dwelling becomes disconnected or damaged and can no longer carry current. This can occur as a result of a downed power line due to severe weather, accidental or inadvertent contact, and maintenance issues (e.g., melted wires, corroded connections, loose connections, etc.). It can also occur if neutral wires or bus bars installation is not performed correctly in the load center. Lastly, aging and the environment could cause a degradation of the neutral system joints, eventually causing a loss of neutral connection in the load center.

Several solutions exist for detecting a voltage imbalance in a single-phase power supply and tripping a main circuit breaker in response to prevent damage. However, these solutions tend to be overly complex, usually requiring a voltage monitoring device to measure the voltage, a relay, and a means for opening the main breaker using a shunt trip circuit.

SUMMARY

Embodiments of the present disclosure provide apparatuses and methods for detecting a voltage imbalance in a single-phase power supply and tripping a circuit breaker in response. The apparatuses and methods herein present an electro-mechanical solution that does not require a voltage monitoring device or any voltage measurements, and is much simpler to implement compared to existing solutions. The disclosed apparatuses and methods use a solenoid-based design that can sense a voltage imbalance without measuring the voltage, then tripping or causing the tripping of a circuit breaker in response.

In some embodiments, the disclosed apparatuses and methods provide a voltage imbalance detector that employs two solenoid coils, each coil coaxially arranged around a slidable metal plunger on opposite sides thereof. One coil is then electrically connected to one line of the 120 V/240 V power supply and to neutral, while the other coil is electrically connected to the other line of the 120 V/240 V power supply and to neutral. When the coils are energized by current from the power supply, each coil induces an equal but opposite electromagnetic force acting on the metal plunger if the power supply voltages are balanced, thereby maintaining the plunger stationary relative to the coils. But if the voltages are not balanced, then one coil will induce a greater (or lesser) electromagnetic force than the other coil, resulting in the plunger moving toward (or away from) the first coil, thereby sensing the voltage imbalance.

In some embodiments, the plunger has a trip arm extending generally perpendicularly from the plunger near the middle thereof. When the plunger is moved by the coils as a result of a voltage imbalance, the trip arm engages a trip latch or similar mechanism on the circuit breaker to thereby trip the breaker. The trip arm on the plunger may engage the breaker trip latch or similar mechanism through direct contact in some embodiments, or it may do so through a shunt trip circuit that then trips the breaker in some embodiments. In some embodiments, the trip arm may resemble a fin or similar structure extending from the plunger externally to the voltage imbalance detector. In some embodiments, a disk shaped contact member or similar structure may be provided on the plunger to engage the trip latch or similar mechanism, or an electronic switch that in turn trips the breaker via a shunt trip circuit.

In general, in one aspect, embodiments of the present disclosure relate to a solenoid-based voltage imbalance detector. The voltage imbalance detector comprises, among other things, a housing having power line terminals and a neutral terminal, and electrically conductive coils coaxially arranged within the housing, each coil electrically connected to a respective power line terminal and the neutral terminal. The voltage imbalance detector further comprises a metal plunger coaxially disposed between the coils within the housing, the metal plunger coaxially slidable between the coils. The coils are configured to induce opposing electromagnetic force, the opposing electromagnetic force pushing on the metal plunger in opposite directions.

In general, in another aspect, embodiments of the present disclosure relate to a power supply circuit. The power supply unit comprises a circuit breaker having a first power line, a second power line, and a neutral connected thereto. The power supply unit further comprises a solenoid-based voltage imbalance detector configured to trip the circuit breaker, the solenoid-based voltage imbalance detector having a first coil and a second coil coaxially arranged therein, the first coil electrically connected to the first power line and the neutral, and the second coil electrically connected to the second power line and the neutral, the first and second coils configured to induce opposing electromagnetic force. The solenoid-based voltage imbalance detector is configured to sense a voltage imbalance between the first and second coils and to trip or cause the circuit breaker to trip upon sensing the voltage imbalance.

In general, in yet another aspect, embodiments of the present disclosure relate to a method of sensing a voltage imbalance between power lines of a power supply. The method comprises, among other things, providing electrically conductive coils coaxially arranged within a housing, and electrically connecting each coil to a respective power line of the power supply and a neutral of the power supply, the coils configured to induce opposing electromagnetic force. The method also comprises supplying current flow in the power lines, the current flow in each power line generating a respective voltage across each coil. The method further comprises sensing a voltage imbalance in the voltage across the coils, and interrupting the current flow in the power lines upon sensing the voltage imbalance.

BRIEF DESCRIPTION OF THE DRAWINGS

The foregoing and other advantages of the disclosed embodiments will become apparent upon reading the following detailed description and upon reference to the drawings, wherein.

DETAILED DESCRIPTION

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in embodiments without departing from the scope of the concepts sought to be protected.

As alluded to above, embodiments of the present disclosure provide apparatuses and methods for detecting a voltage imbalance in a single-phase electrical power supply, such as a 120 V/240 V power supply. The apparatuses and methods herein present a mechanical voltage imbalance detector that uses two solenoid coils to sense a voltage imbalance, each coil arranged around a slidable metal plunger on opposite sides thereof. Specifically, current from the power supply energizes each coil, which causes the coils to exert an equal but opposite electromagnetic force on the metal plunger when the power supply voltages are balanced (e.g., within 10 Volts). When the voltages from the power supply are out of balance, one coil will exert a greater (or lesser) electromagnetic force on the plunger than the other coil, causing the plunger to move toward (or away from) the first coil.

Figure 1A:
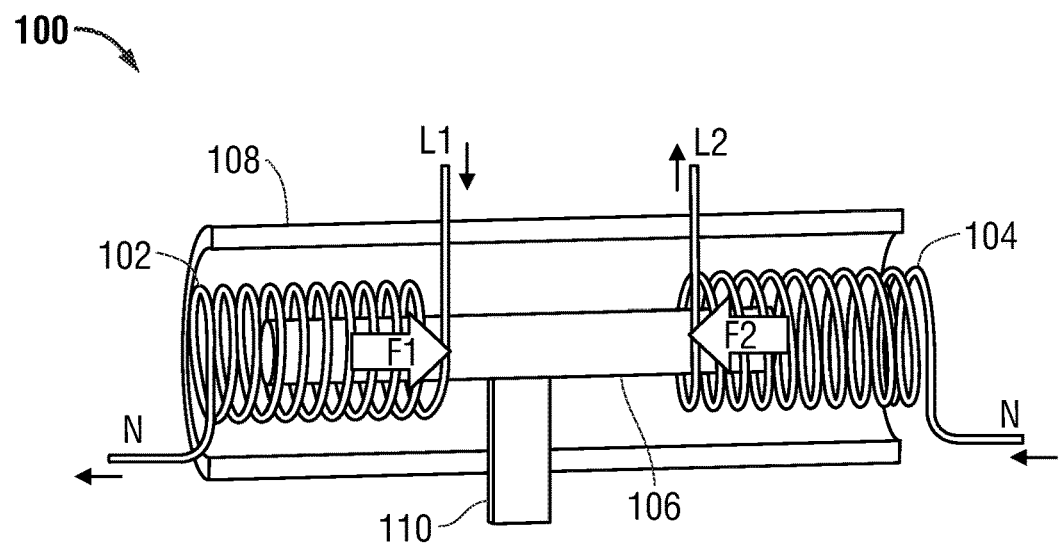
FIGS. 1A and 1B illustrate cutaway views of an exemplary solenoid-based voltage imbalance detector in accordance with embodiments of this disclosure.
Figure 1B:
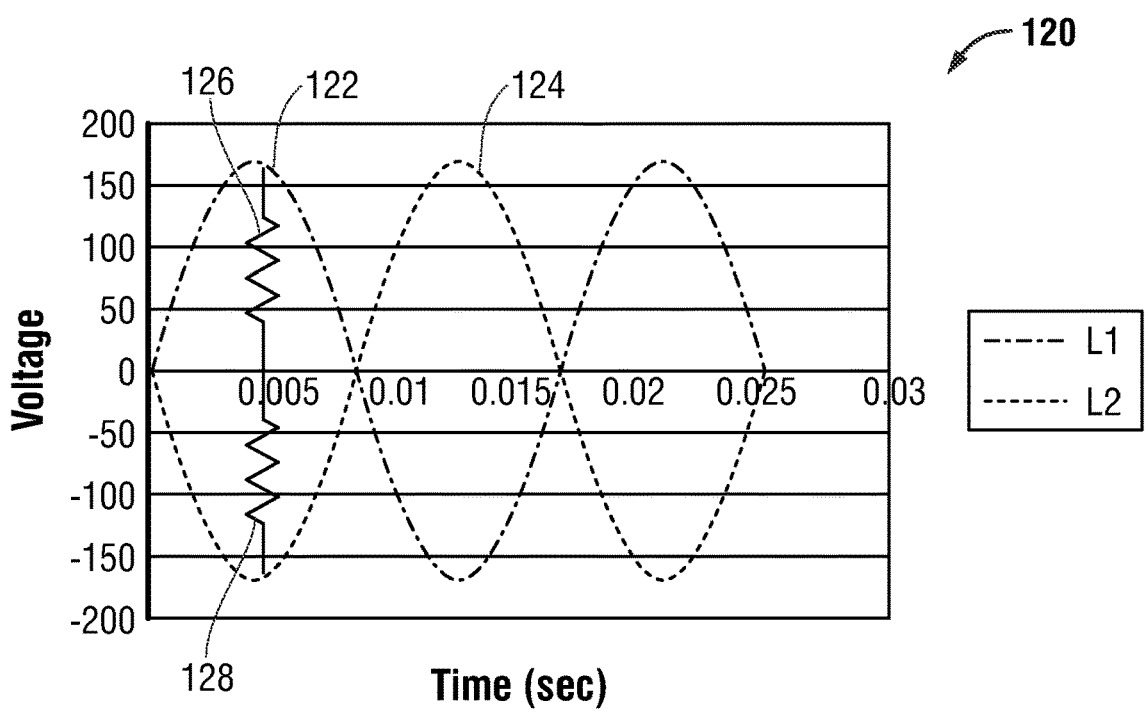

Referring now to FIGS. 1A and 1B, cutaway views are shown for a conceptual solenoid-based voltage imbalance detector 100 in accordance with embodiments of the present disclosure. Turning first to FIG. 1A, the conceptual voltage imbalance detector 100 has two solenoid coils 102, 104 arranged coaxially around a metal plunger 106 on opposite sides thereof and separated by a predefined distance, which separation may be selected as needed for a particular application (including no separation and partial overlap). The coils 102, 104 and the metal plunger 106 are enclosed within a generally tubular housing 108 that serves to protect the coils 102, 104 and any connections thereto. One of the coils 102 is electrically connected to one power line (L1) of a single-phase electrical power supply (not expressly shown) and neutral (N), while the other coil 104 is electrically connected to another power line (L2) and neutral (N). Neither of the coils 102, 104 is electrically connected to the plunger 106. The plunger 106 in this example resembles a shaft or rod and is arranged within the housing 108 such that it is coaxially slidable within the coils 102, 104.

FIG. 1B is a graph 120 showing the voltages across the two coils 102, 104 from FIG. 1A. In the graph 120, the vertical axis represents voltage, while the horizontal axis represents time. The voltage across the first coil 102 is represented by graph line 122, while the voltage across the second coil 104 is represented by graph line 124. Resistance symbols 126, 128 are depicted in a voltage divider arrangement with the coils 102, 104 to indicate that loads are connected to the coils 102, 104 which act as voltage dividers. As shown by the graph lines 122, 124, when there is no voltage imbalance between the two power lines (L1, L2), the voltages across the two coils 102, 104 have equal magnitude but opposite polarity.

More specifically, when there is no voltage imbalance, the electromagnetic force (F1 and F2) generated by the current flowing through the two coils 102, 104 oppose each other equally, so the plunger 106 stays stationary relative to the coils 102, 104. When the voltage for one coil 102 is significantly higher or lower than the voltage for the other coil 104, a force imbalance will arise that pushes the plunger 106 toward one side or the other. In general, assuming the coils 102, 104 and the plunger 106 are properly arranged within the housing 108, the motion of the plunger 106, once begun, will continue until the plunger 106 reaches some physical limit within the housing 108. This movement of the plunger 106 causes a trip arm 110 (or similar extension) protruding from the plunger 106 to engage a trip latch (or similar trip mechanism) on the main breaker, thereby tripping the breaker. The entire process can occur very quickly, for example, within a few 60 Hz cycles.

Figure 2A:
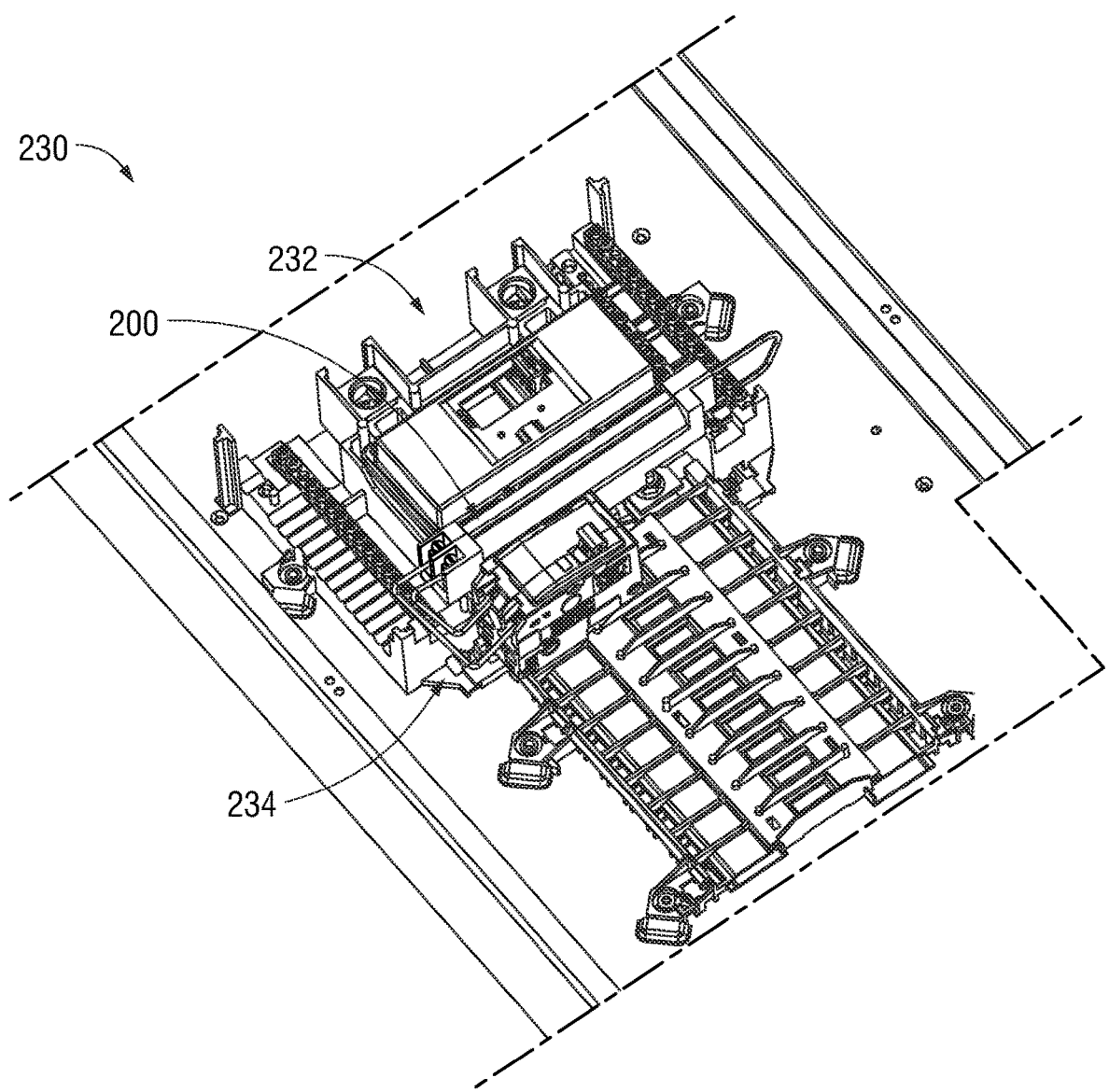
FIGS. 2A-2C illustrate partial views of a panelboard having an exemplary voltage imbalance detector mounted therein in accordance with embodiments of this disclosure.
Figure 2B:
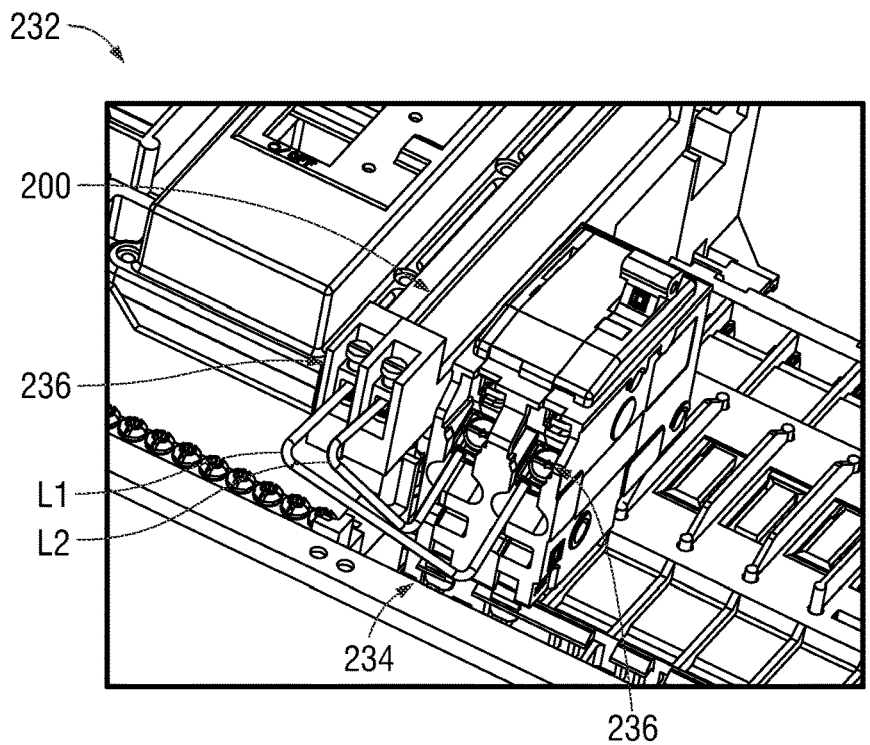
Figure 2C:
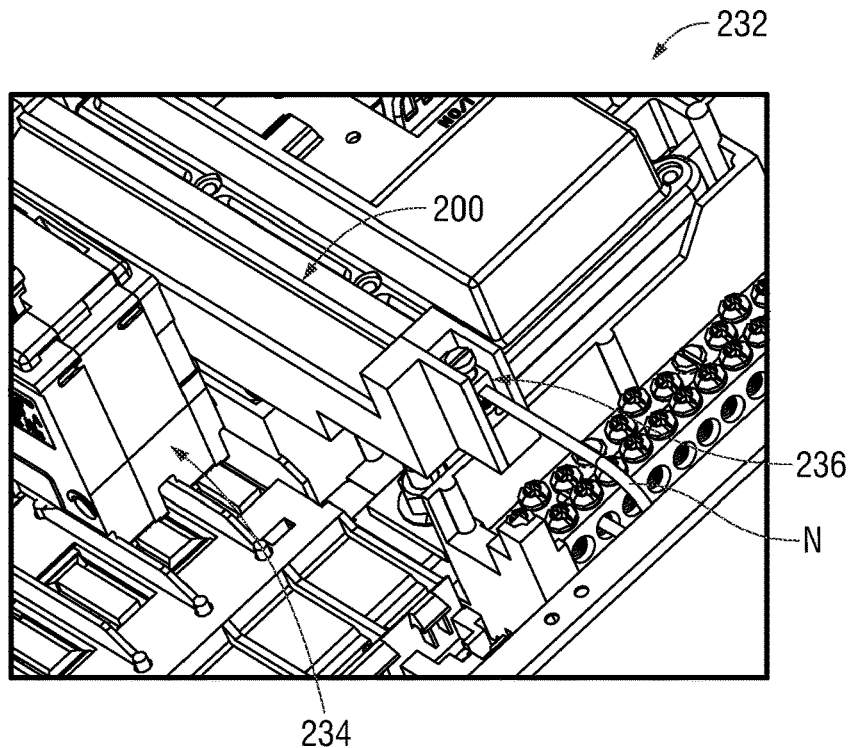

Referring next to FIGS. 2A-2C, perspective views are shown of an exemplary solenoid-based voltage imbalance detector 200 mounted in an electrical panelboard 230. The electrical panelboard 230 is similar to typical panelboards insofar as there is a main circuit breaker 232 and one or more branch breakers 234 installed thereon for feeding current from a power supply (e.g., power utility) to various loads. The voltage imbalance detector 200 may then be mounted adjacent or near the main breaker 232, as shown in FIG. 2A, to detect voltage imbalances in the power supply and trip or cause the main breaker 232 to trip accordingly. Connection between the voltage imbalance detector 200 and the power lines (L1, L2) and neutral (N) of the power supply may be accomplished via lugs 236 or other commonly used terminal connections known to those skilled in the art, as shown in FIGS. 2B and 2C, respectively.

In general operation, each half the panelboard 230 normally receives 120 V for a total of 240 V. When the neutral (N) is lost, a voltage imbalance arises and the loads connected to the panelboard 230 (via the branch breakers 234) act as voltage dividers. Thus, if one half of the panelboard 230 has significantly more resistance than the other half, the voltage imbalance can be driven to its electrical extreme. The voltage imbalance detector 200 prevents this situation by detecting the voltage imbalance and tripping or causing the main breaker 232 to trip, thereby cutting off power flowing through the panelboard 230 to the various loads. Preferably the voltage imbalance detector 200 is small enough to fit on the panelboard 230 without taking up space reserved for other purposes.

Figure 3A:
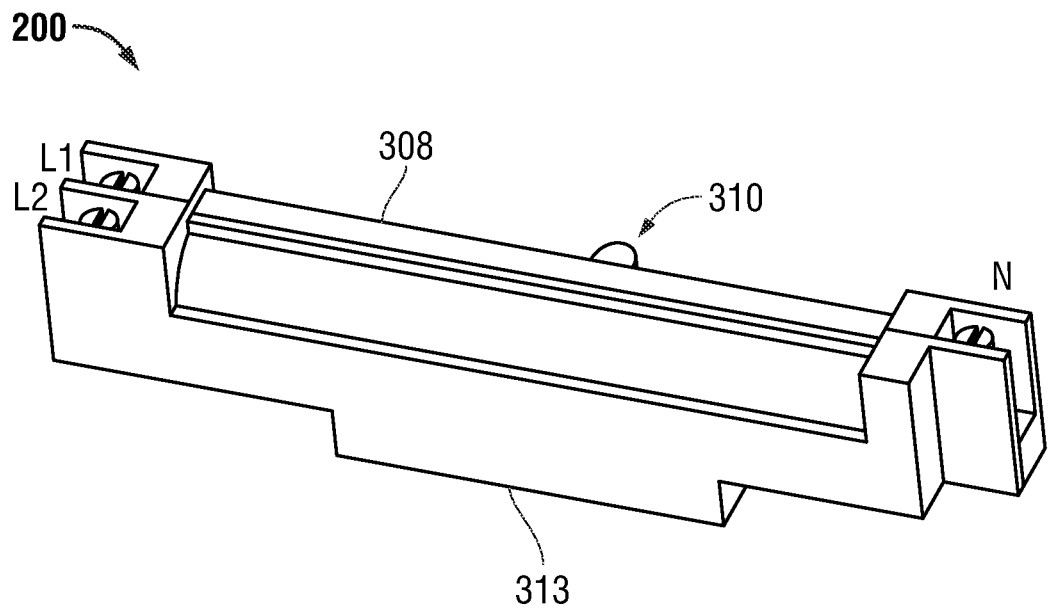
FIGS. 3A and 3B illustrate perspective views of an exemplary module for a voltage imbalance detector in accordance with embodiments of this disclosure.
Figure 3B:
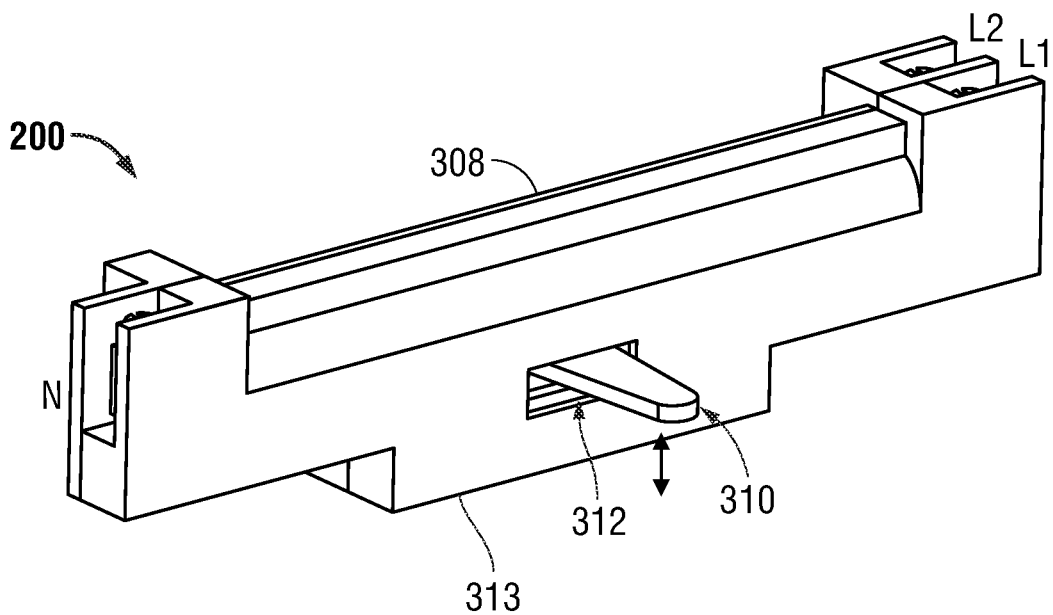

FIGS. 3A and 3B show close-up perspective views of the solenoid-based voltage imbalance detector 200 in accordance with embodiments of the present disclosure. As these views show, the voltage imbalance detector 200 has an elongate housing 308 with terminals (e.g., lugs) disposed at one end for connection to the power lines (L1, L2) and another terminal (e.g., a lug) disposed at the opposite end for connection to the neutral (N). A side opening 312 (e.g., a slit) is provided in one side of the housing 308 near the midpoint between the terminal ends. The side opening 312 is sized and shaped to allow a trip arm 310 to protrude from the side opening 312 perpendicularly to the housing 308. The trip arm 310 is pivotably mounted in the housing 308 such that the end of the trip arm 310 protruding from the side opening 312 can pivot downward and upward, as indicated by the double-headed arrow. The downward and upward pivot allows the trip arm 310 to engage a trip latch or similar mechanism of the main breaker 232 (FIGS. 2A-2C) when the voltage imbalance detector 200 is mounted in the panelboard 230. A generally rectangular step 313 may be provided on the housing 308 in embodiments where additional room is needed within the housing 308 to accommodate the trip arm 310.

Figure 4A:
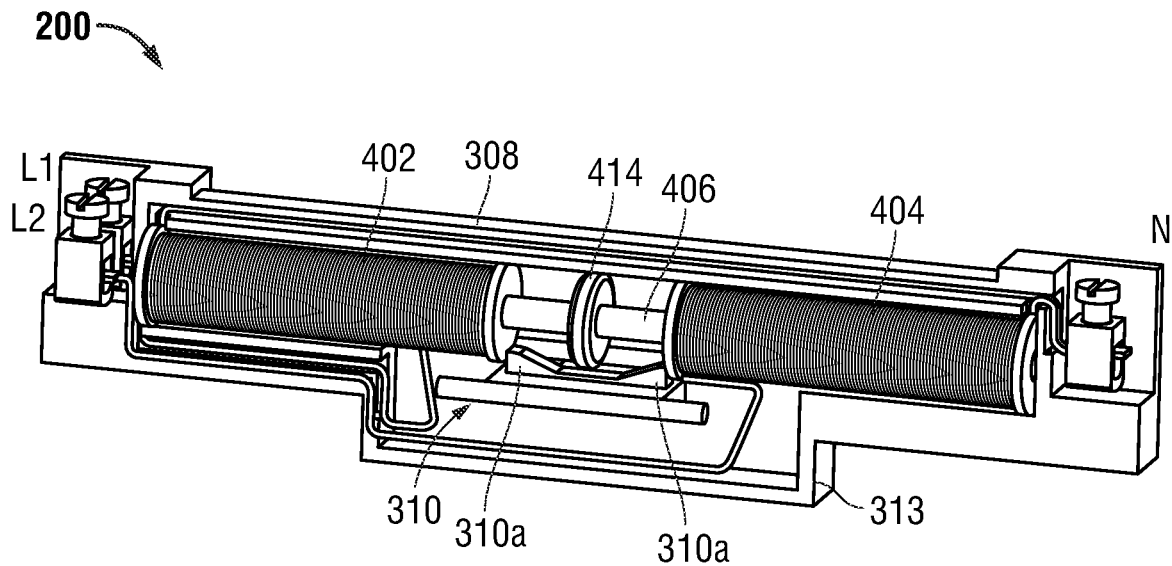
FIGS. 4A and 4B illustrate cutaway views of the exemplary module from FIGS. 3A and 3B in accordance with embodiments of this disclosure.
Figure 4B:
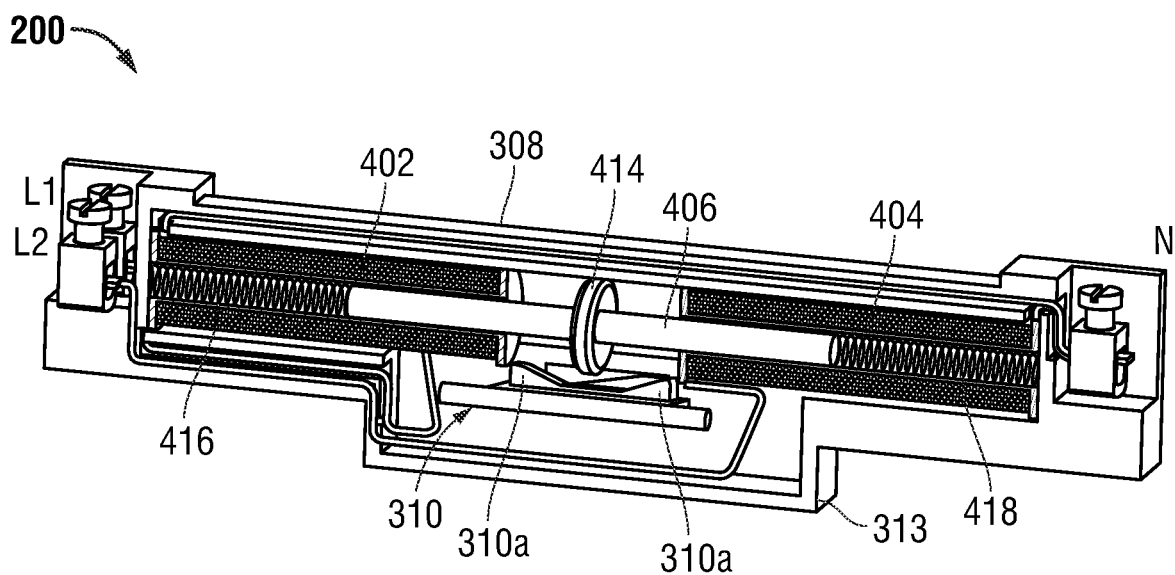

FIGS. 4A and 4B show cutaway views of the housing 308 with the solenoid-based voltage imbalance detector 200 installed therein and the trip arm 310 mounted adjacent to (e.g., below) the voltage detector 200. As can be seen in these views, the voltage imbalance detector 200 is composed of two coil bobbins 402, 404 fixedly secured within the housing 308. The coil bobbins 402, 404 are arranged coaxially around a plunger 406 on opposite sides thereof and separated from each other by a predefined distance, which may be selected as needed. One of the coil bobbins 402, 404 is electrically connected to one power line (L1) of a single-phase electrical power supply (not expressly shown) and neutral (N), while the other coil bobbin 402, 404 is electrically connected to another power line (L2) and neutral (N). Neither of the coil bobbins 402, 404 is electrically connected to the plunger 406. The plunger 406 is slidably disposed within the coil bobbins 402, 404 and can freely slide coaxially toward or away from either coil bobbins 402, 404 unless otherwise prevented. Coil springs 416, 418 are arranged coaxially within the coil bobbins 402, 404, one coil spring 416, 418 on each end of the plunger 406, to bias the plunger 406 toward the midpoint of the housing 308.

A flange or other disc-shaped contact member 414 is coaxially mounted on the plunger 406 in some embodiments. The contact member 414 has a larger diameter than the plunger 406 and thus moves through a larger volume than the plunger 406. This allows the contact member 414 to come into contact with a contact portion 310a of the trip arm 310 when the plunger 406 slides toward (or away from) one of the coil bobbins 402, 404. The contact with the contact portion 310a depresses the trip arm 310, thereby tripping, or causing tripping of, the main breaker 232. Other shapes besides a circular shape may also be used for the contact member 414, such as any shape that allows the contact member 414 to come into contact with the contact portion 310a of the trip arm 310 when the plunger 406 slides toward (or away from) either coil bobbin 402, 404.

Figure 5:
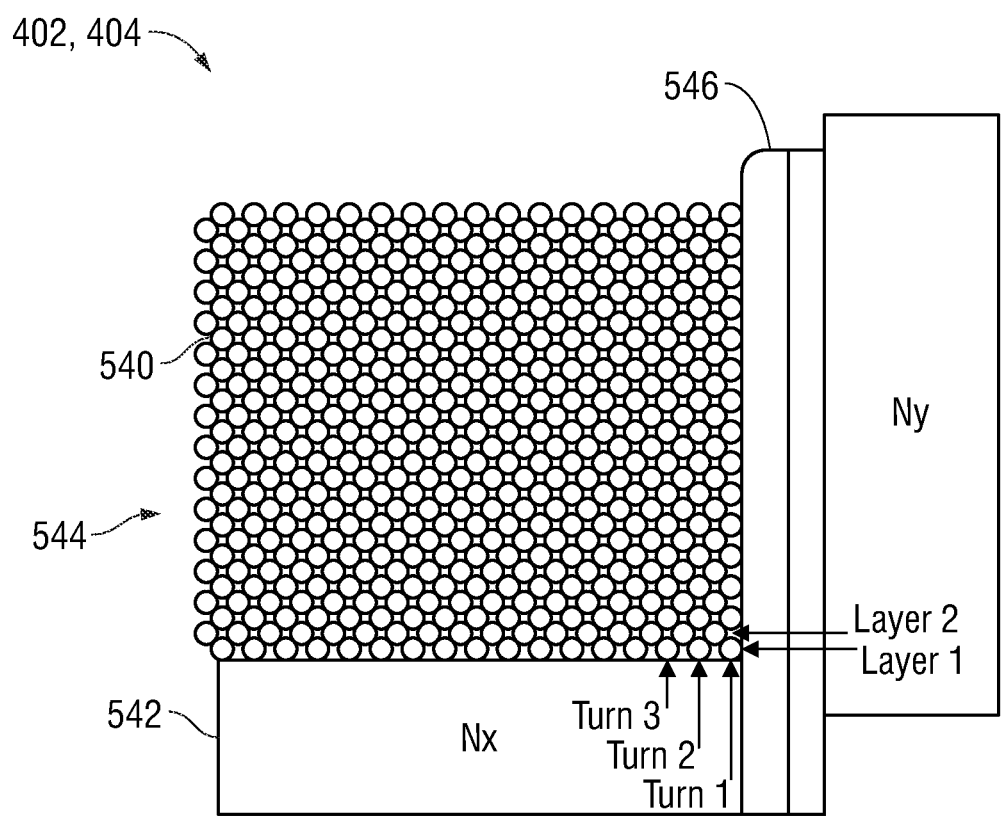
FIG. 5 illustrates a cross-sectional view of an exemplary coil for a voltage imbalance detector in accordance with embodiments of this disclosure.

FIG. 5 shows a partial cross-sectional view of one of the exemplary coil bobbins 402, 404 from FIGS. 4A and 4B in accordance with embodiments of the present disclosure. In general, the coil bobbins 402, 404 are configured to induce equal but opposite electromagnetic force in the absence of a voltage imbalance. As can be seen, each coil bobbin 402, 404 is constructed of a wire 540 that has been coiled or wrapped around a generally tubular body 542 to form a series of windings 544 around the tubular body 542. The windings 544 are arranged in a series of layers for a total of Ny layers of windings, each layer having a certain number of wraps or turns for a total of Nx turns per layer. A generally circular end wall 546 is provided at one end of the tubular body 542 and a similar end wall (not visible here) is provided at an opposite end of the tubular body 542 to retain the windings 544 on the tubular body.

The wire 540 may be any wire, such as copper wire, having enough resistance to minimize the flow of current through the windings 544 to reduce power loss. However, sufficient current still needs to flow through a sufficient number of turns to induce a sufficient amount of magnetic force to physically move the plunger 406 to trip or cause tripping of the main breaker 232. Therefore, in addition to resistance, the type of wire that can be used for the wire 540 may also depend on the number of turns contemplated for the particular application. An example of a suitable wire that may be used as the wire 540 is 37 AWG magnet wire.

FIGS. 6A-6D are cutaway front and side views of the exemplary voltage imbalance detector 200 showing the trip arm 310 being engaged by the plunger 406 and the contact member 414 thereon.

Figure 6B:
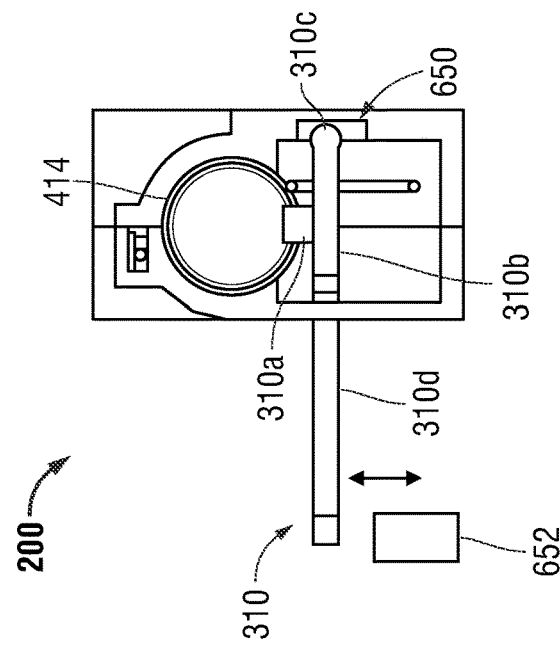
FIGS. 6A-6D illustrate cutaway views showing exemplary operation of a voltage imbalance detector in accordance with embodiments of this disclosure.
Figure 6A:
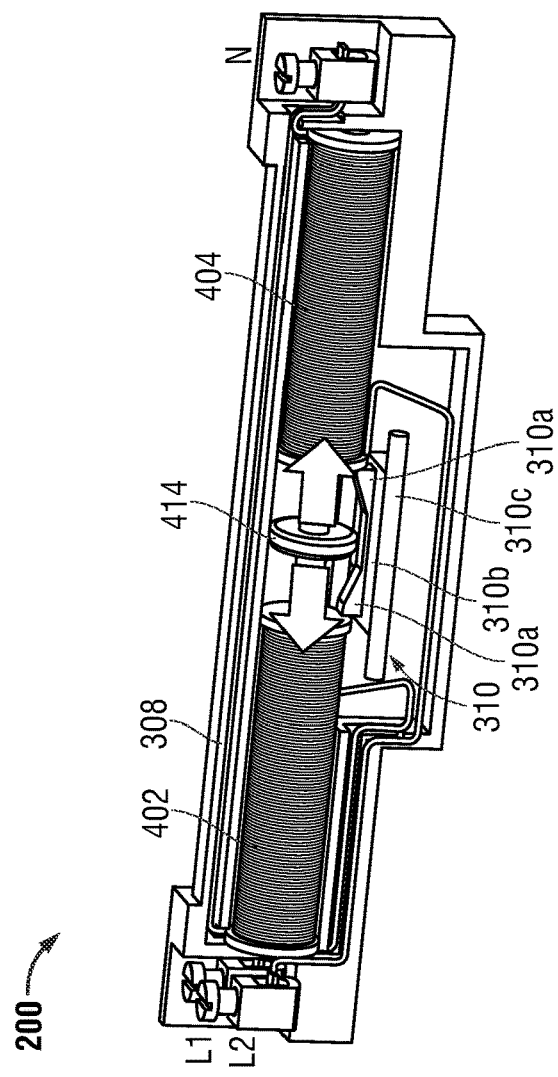
Figure 6D:
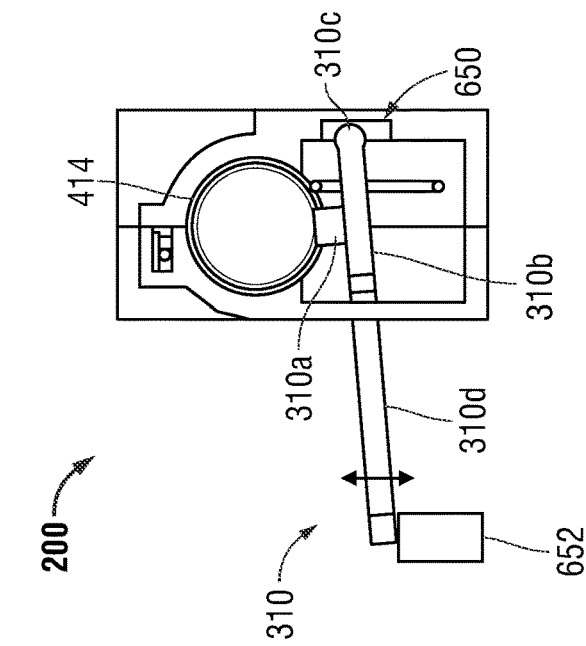
Figure 6C:
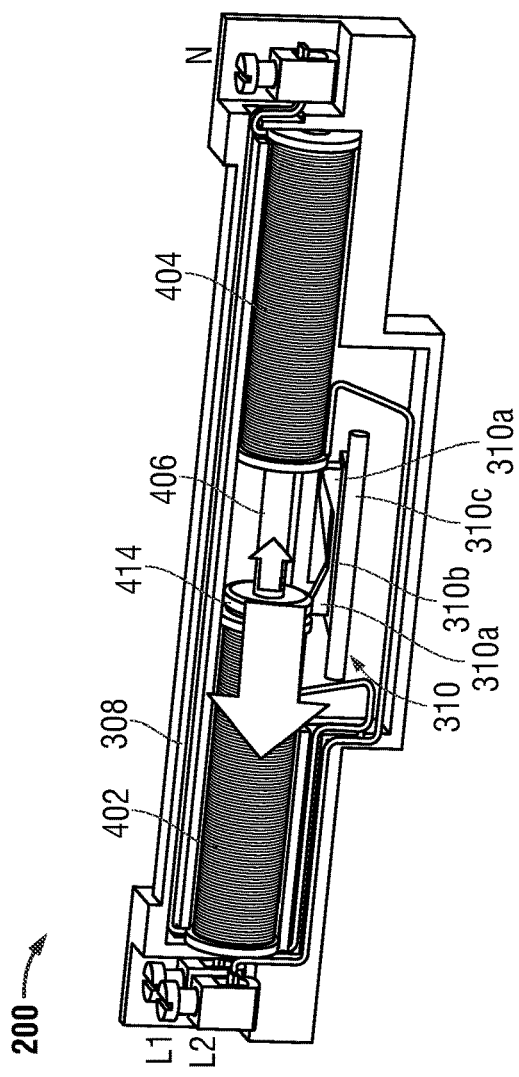

As best seen in FIGS. 6A and 6C, the trip arm 310 has a generally rectangular planar base portion 310b that provides support for the rest of the trip arm 310 in some embodiments. The planar base portion 310b may have a length that is longer than the length of the side opening 312 mentioned earlier in some embodiments to prevent the trip arm 310 from inadvertently coming out of the side opening 312. The contact portions 310a mentioned earlier are formed on the top side of the planar base portion 310b, one contact portion 310a on or near each end of the planar base portion 310b. The contact portions 310a may resemble ramps that are oriented in opposite directions in some embodiments so the contact member 414 contacts and travels along the upward slope of the contact portions 310a when the plunger 406 moves toward (or away from) either coil bobbin 402, 404.

As best seen in FIGS. 6B and 6D, a pivot portion 310c is provided on the planar base portion 310b extending along the length of the planar base portion 310b in some embodiments. The pivot portion 310c allows a fin portion 310d on the planar base portion 310b to pivot or rotate with respect to the voltage imbalance detector 200. The pivot portion 310c may resemble a pin and may be formed on or attached to the planar base portion 310b and in some embodiments. Such a pivot portion 310c may then be hingedly mounted in the housing 308 to allow the fin portion 310d to pivot about a longitudinal axis of the pivot portion 310c. In the example shown, each end of the pivot portion 310c is mounted within a retention recess or pocket 650 in the housing 308 so that the trip arm 310 can rotate downward and upward relative to the housing 308.

In general operation, a spring or other biasing means (not expressly shown) biases the trip arm 310 in an upward (i.e., non-tripping) position above a trip latch 652 or similar trip mechanism of the main breaker 232 (FIGS. 2A-2C). As long as the voltages across the coil bobbins 402, 404 are approximately equal, the plunger 406 and the contact member 414 mounted thereon remain stationary. But when the voltages across the coil bobbins 402, 404 become imbalance by more than a certain amount (e.g., greater than 10 Volts), the plunger 406 and the contact member 414 mounted thereon begin to slide toward (or away from) one of the coil bobbins 402, 404. This motion causes the contact member 414 to contact and slide along the top of one of the contact portions 310a. The contact rotates the trip arm 310 downward into the trip latch 652, as indicated by the double-headed arrow, which trips or causes tripping of the main breaker 232.

Figure 7:
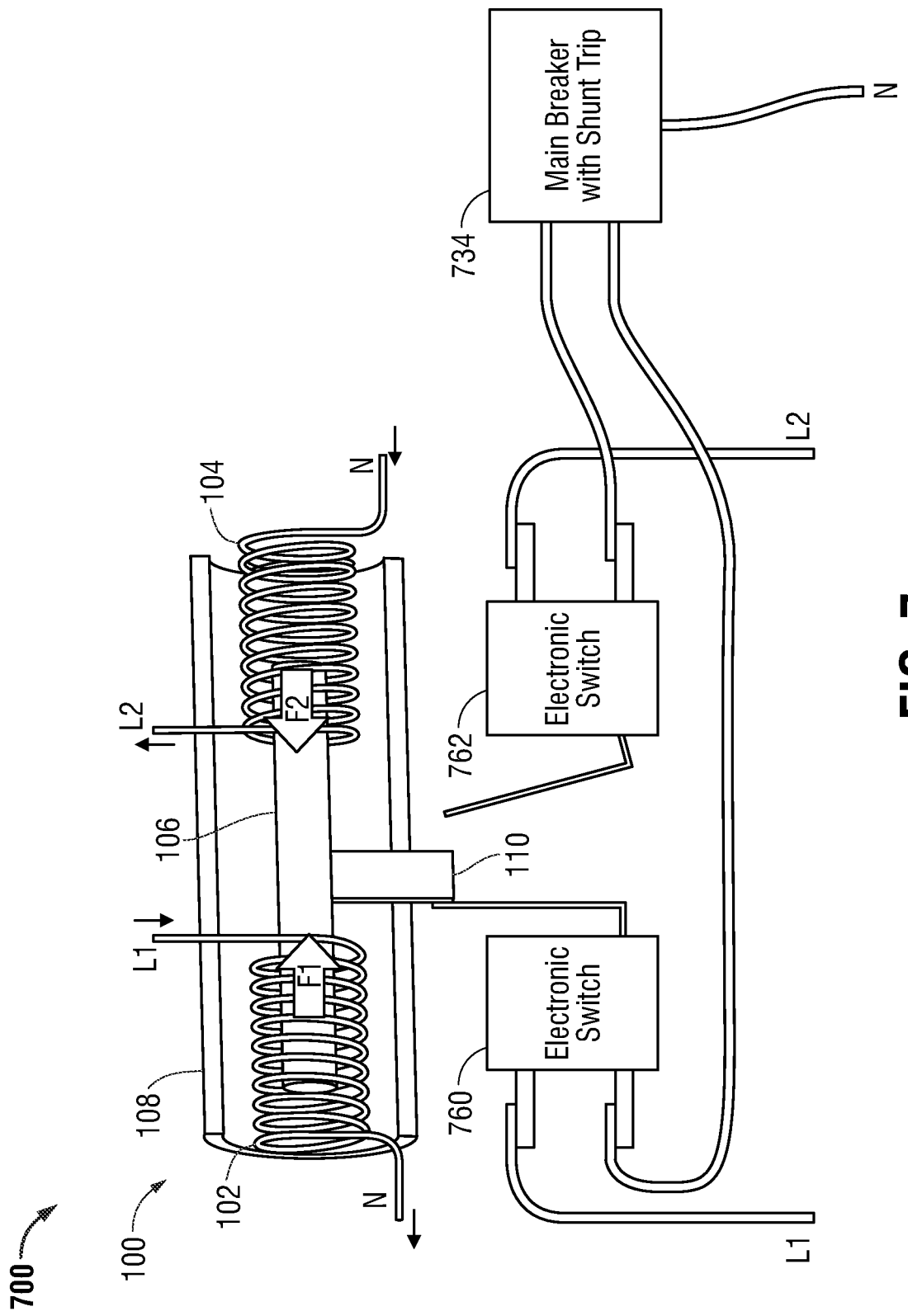
FIG. 7 illustrates a cutaway view of an alternative solenoid-based voltage imbalance detector in accordance with embodiments of this disclosure.

Turning now to FIG. 7, an alternative implementation is shown in which, rather than directly engage the trip latch or similar trip mechanism of the main breaker, electronic switches are used to actuate a shunt trip circuit that in turn causes the main breaker to trip. In the FIG. 7 example, a power supply circuit 700 is shown composed of the voltage imbalance detector 100 from FIGS. 1A and 1B and a main circuit breaker 734 equipped with a shunt trip circuit. Such a power supply circuit 700 may be part of an electrical panel board in some embodiments. Then, when a voltage imbalance arises in the power supply, the voltage imbalance detector 100 detects the voltage imbalance as described previously. However, instead of engaging a trip latch (or similar trip mechanism), the plunger 106 and the trip arm 110 engages one of two electronic switches 760 or 762 to cause the main breaker 734 to trip via its shunt trip circuit. An advantage of this implementation is that it reduces the amount of force the coils needs to apply to the plunger 106 in order to trip the breaker. Instead of tripping a mechanical latch, which requires more force, the plunger 106 only needs to toggle a switch (e.g., a microswitch).

Figure 8:
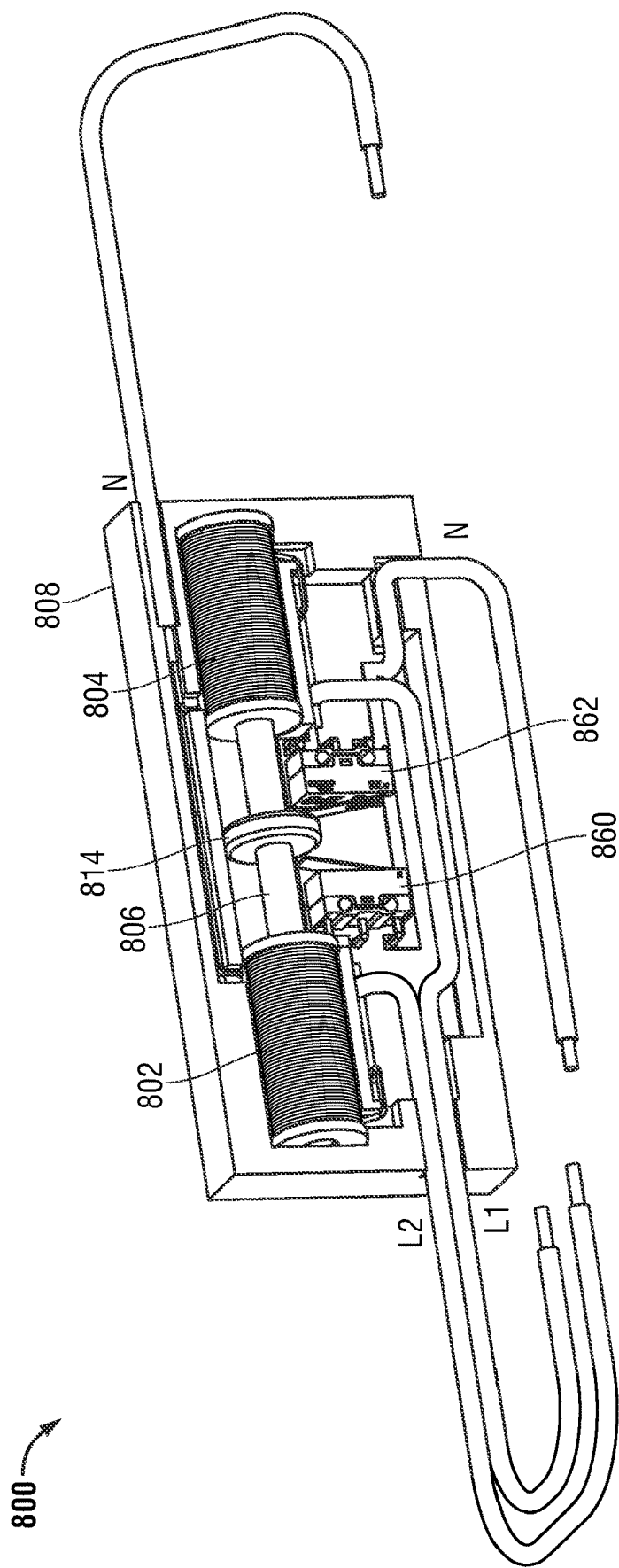
FIG. 8 illustrates a cutaway view of another alternative voltage imbalance detector in accordance with embodiments of this disclosure.

FIG. 8 shows another exemplary voltage imbalance detector 800 that uses electronic switches. The voltage imbalance detector 800 in this example is similar to the voltage imbalance detector described previously in FIGS. 4A and 4B insofar as there are two coil bobbins 802, 804 fixedly secured within a housing 808. The coil bobbins 802, 804 are arranged coaxially around a plunger 806 on opposite sides thereof and separated from each other by a predefined distance, which may be selected as needed. One of the coil bobbins 802, 804 is again electrically connected to one power line (L1) of a single-phase electrical power supply (not expressly shown) and neutral (N), while the other coil bobbin 802, 804 is electrically connected to another power line (L2) and neutral (N). Neither coil bobbin 802, 804 is electrically connected to the plunger 806.

As with its counterpart in FIGS. 4A and 4B, the plunger 806 here is slidably disposed within the coil bobbins 802, 804 and can freely slide coaxially toward or away from either coil bobbins 802, 804 unless otherwise prevented. Coil springs (not visible here) are again arranged coaxially within the coil bobbins 802, 804, one coil spring on each end of the plunger 806, to bias the plunger 806 toward the midpoint of the housing 808. However, instead of a trip arm, electronic switches 860, 862 are provided within the housing 808 adjacent each coil bobbin 802, 804. This arrangement is similar to the arrangement of FIG. 7 and has a similar advantage of reducing the amount of force needed to actuate the switches 860, 862 to trip the breaker. When a voltage imbalance arises across the coil bobbins 802, 804, the plunger 806 and the contact member 814 thereon engages one of the electronic switches 860 or 862 to cause the main breaker to trip via its shunt trip circuit. It is of course possible to use a single electronic switch 860 or 862 instead of two such switches, for example, by actuating the electronic switch 860 or 862 via a pivotably mounted trip arm like the trip arm 310 discussed above.

Figure 9:
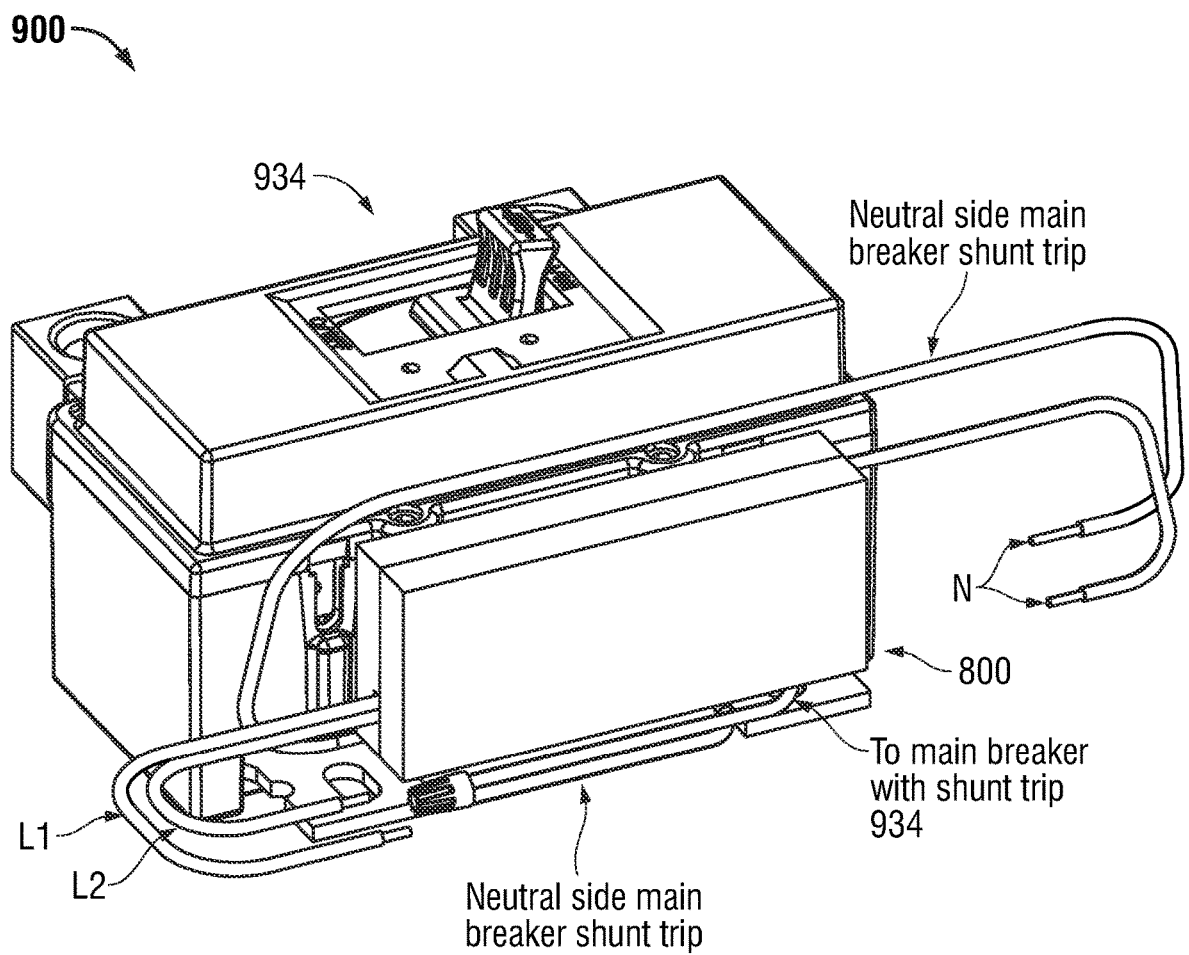
FIG. 9 illustrates a perspective view of a circuit breaker having an exemplary voltage imbalance detector in accordance with embodiments of this disclosure.

FIG. 9 shows an example of an alternative power supply circuit 900, this one composed of the voltage imbalance detector 800 from FIG. 8 and another main breaker 934 having a shunt trip circuit therein. In a typical arrangement, the power supply circuit 900 is installed on an electrical panelboard, with the voltage imbalance detector 800 adjacent to or near the main breaker 934 on the panelboard. The line side of the voltage imbalance detector 800 is connected to the line side of main breaker 934 via the power lines (L1, L2), and the neutral side of the voltage imbalance detector 800 is connected to the main breaker 934 via the neutral lines (N). When a voltage imbalance arises, the voltage imbalance detector 800 detects the voltage imbalance and engages one of the electronic switches 860 or 862 to cause the main breaker 934 to trip via its shunt trip circuit.

Thus far, several specific implementations of a voltage balance detector have been shown and described in accordance with embodiments of the present disclosure. Following now is a method that may be used to implement the various voltage imbalance detectors herein.

Figure 10:
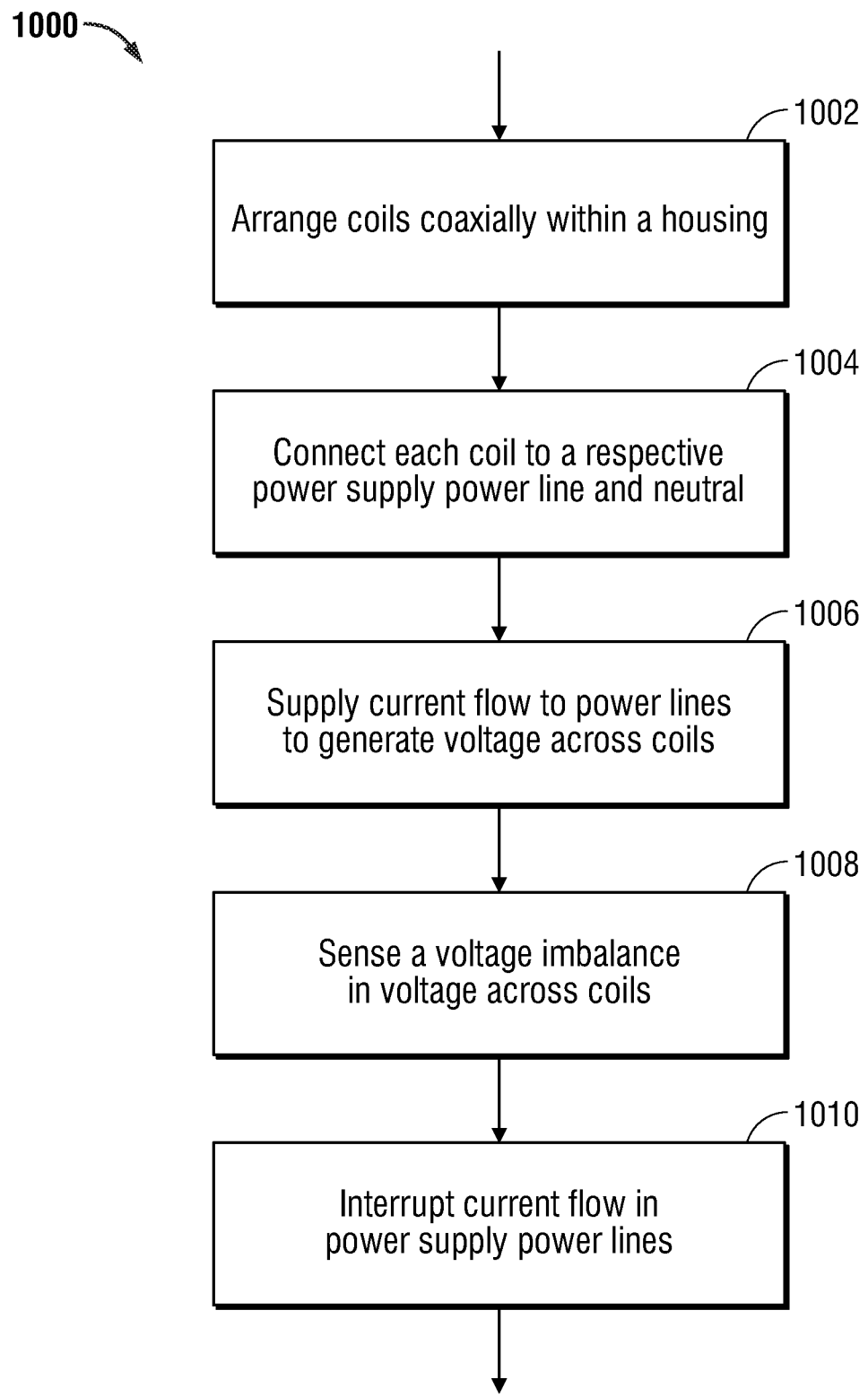
FIG. 10 illustrates a flowchart for a method of sensing a voltage imbalance in accordance with embodiments of this disclosure.

Referring now to FIG. 10, a flowchart 1000 is shown representing a method of sensing a voltage imbalance in accordance with embodiments of this disclosure. The flowchart 1000 generally begins at 1002 where electrically conductive coils are coaxially arranged within a housing. In some embodiments, the coils are separated by a predefined distance, which separation may be selected as needed for a particular application (including no separation and partial overlap). At 1004, the coils are connected to the power supply power lines and the neutral, each coil connected to a respective power line and neutral via a respective power line terminal and neutral terminal on the housing. The coils are electrically connected so that they induce opposing electromagnetic force when current from the power lines flows through the coils.

At 1006, current flow is supplied to the power lines to energize the coils and generate a voltage across the respective coils. At 1008, any voltage imbalance that may be present in the voltages across the coils is sensed. This may be accomplished, for example, by providing a metal plunger coaxially disposed between the coils so that the opposing electromagnetic force induced by the coils push on the plunger in opposite directions. The electromagnetic force moves the metal plunger, which is coaxially slidable between the coils, toward (or away from) a respective one of the coils when a voltage imbalance is present.

At 1010, the current flow in the power lines is interrupted in response to the voltage imbalance being sensed. This may entail, for example, tripping a circuit breaker to which the power supply power lines are connected when the voltage imbalance is sensed. Tripping of the circuit breaker may be accomplished, for example, by providing a trip arm protruding perpendicularly from the housing through a side opening in the housing. Movement of the plunger causes the trip arm to actuate a trip latch or similar mechanism of the circuit breaker, or an electronic switch connected to a shunt trip circuit of the circuit breaker. In some embodiments, the trip arm extends from the plunger. In some embodiments, the trip arm is pivotally mounted about a longitudinal axis within the housing, and a contact member extending from the metal plunger contacts the pivotally mounted trip arm to actuate the trip latch or electronic switch.

It should be understood that the above description is intended to be illustrative, and not restrictive. For example, although several embodiments herein show the coils being coaxially arranged and spaced apart from each other by a predefined distance, it is also possible for the coils to overlap, at least partially, with the plunger disposed within both coils. So long as the coils can induce opposing electromagnetic force (i.e., are electrically separate from one another), the principles and teachings disclosed herein apply.

Thus, many alternative implementations will be apparent upon reading and understanding the above description. Therefore, although the disclosure describes specific examples, it is recognized that the systems and methods of the disclosure are not limited to the examples described herein, but may be practiced with modifications within the scope of the appended claims. Accordingly, the specification and drawings are to be regarded in an illustrative sense rather than a restrictive sense, the scope of the disclosure being determined with reference to the appended claims, along with the full scope of equivalents to which such claims are entitled.

I claim:

1. A solenoid-based voltage imbalance detector, comprising:
   a housing having power line terminals and a neutral terminal;
   coils coaxially arranged within the housing, each coil electrically connected to a respective power line terminal and the neutral terminal;
   a metal plunger coaxially disposed between the coils within the housing, the metal plunger coaxially slidable between the coils; and
   a trip arm pivotably mounted about a longitudinal axis thereof within the housing;
   wherein the coils are configured to induce opposing electromagnetic force, the opposing electromagnetic force pushing on the metal plunger in opposite directions.

2. The solenoid-based voltage imbalance detector of claim 1, wherein the housing has a side opening formed therein and the trip arm protrudes from the side opening perpendicularly to the housing.

3. The solenoid-based voltage imbalance detector of claim 2, wherein the trip arm extends from the plunger through the side opening perpendicularly to the housing.

4. The solenoid-based voltage imbalance detector of claim 1, further comprising a contact member extending from the metal plunger within the housing, the contact member configured to contact the pivotably mounted trip arm to thereby depress the pivotably mounted trip arm.

5. The solenoid-based voltage imbalance detector of claim 1, further comprising bobbins fixedly secured within the housing, wherein each coil is wound around a respective bobbin.

6. The solenoid-based voltage imbalance detector of claim 5, further comprising a spring coaxially disposed within each bobbin, the spring in each bobbin configured to bias the metal plunger toward the other bobbin.

7. A power supply circuit, comprising:
   a circuit breaker having a first power line, a second power line, and a neutral connected thereto; and
   a solenoid-based voltage imbalance detector configured to trip the circuit breaker, the solenoid-based voltage imbalance detector having a first coil and a second coil coaxially arranged therein, the first coil electrically connected to the first power line and the neutral, and the second coil electrically connected to the second power line and the neutral, the first and second coils configured to induce opposing electromagnetic force;
   wherein the solenoid-based voltage imbalance detector is configured to sense a voltage imbalance between the first and second coils and to trip or cause the circuit breaker to trip upon sensing the voltage imbalance.

8. The power supply circuit of claim 7, wherein the solenoid-based voltage imbalance detector trips the circuit breaker by actuating a trip latch of the circuit breaker.

9. The power supply circuit of claim 7, wherein the circuit breaker includes a trip shunt circuit and an electronic switch is connected to the trip circuit, and wherein the solenoid-based voltage imbalance detector causes the circuit breaker to trip by actuating the electronic switch connected to the trip shunt circuit.

10. The power supply circuit of claim 7, wherein the solenoid-based voltage imbalance detector further comprises:
   a housing configured to house the first and second coils therein; and
   a metal plunger coaxially disposed between the first and second coils within the housing, the metal plunger coaxially slidable between the first and second coils;
   wherein the opposing electromagnetic force induced by the first and second coils push on the metal plunger in opposite directions.

11. The power supply circuit of claim 10, wherein the housing has a side opening formed therein, the solenoid-based voltage imbalance detector further comprising a trip arm protruding from the side opening perpendicularly to the housing.

12. The power supply circuit of claim 11, wherein the trip arm extends from the plunger through the side opening perpendicularly to the housing.

13. The power supply circuit of claim 11, wherein the trip arm is pivotably mounted about a longitudinal axis thereof within the housing.

14. The power supply circuit of claim 13, wherein the solenoid-based voltage imbalance detector further comprises a contact member extending from the metal plunger within the housing, the contact member configured to contact the pivotably mounted trip arm to thereby depress the pivotably mounted trip arm.

15. The power supply circuit of claim 10, wherein the solenoid-based voltage imbalance detector further comprises bobbins fixedly secured within the housing, and each of the first and second coils is wound around a respective bobbin.

16. A method of sensing a voltage imbalance between power lines of a power supply, the method comprising:
   providing coils coaxially arranged within a housing;
   electrically connecting each coil to a respective power line of the power supply and a neutral of the power supply, the coils configured to induce opposing electromagnetic force;
   supplying current flow in the power lines, the current flow in each power line generating a respective voltage across each coil;
   sensing a voltage imbalance in the voltage across the coils; and
   interrupting the current flow in the power lines upon sensing the voltage imbalance.

17. The method of claim 16, wherein sensing the voltage imbalance in the voltage across the coils comprises one of the coils inducing a stronger electromagnetic force compared to the other coil.

18. The method of claim 17, wherein the power lines are connected to a circuit breaker and interrupting the current flow in the power lines comprises tripping the circuit breaker.

19. The method of claim 18, wherein tripping the circuit breaker comprises actuating a trip latch of the circuit breaker or actuating an electronic switch connected to a trip shunt circuit of the circuit breaker.

\* \* \* \* \*